United States Patent
Cavanna et al.

(10) Patent No.: US 7,293,206 B2
(45) Date of Patent: Nov. 6, 2007

(54) TEST DATA PATTERN FOR TESTING A CRC ALGORITHM

(75) Inventors: Vicente V. Cavanna, Loomis, CA (US); Jeffrey R. Murphy, Rocklin, CA (US); Dylan Jackson, Roseville, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 455 days.

(21) Appl. No.: 10/939,880

(22) Filed: Sep. 13, 2004

(65) Prior Publication Data

US 2006/0059404 A1    Mar. 16, 2006

(51) Int. Cl.
    H03M 13/00    (2006.01)
    G06F 11/00    (2006.01)
(52) U.S. Cl. ................................ 714/703; 714/781
(58) Field of Classification Search ............ 714/703, 714/781
    See application file for complete search history.

(56) References Cited

U.S. PATENT DOCUMENTS

| | | | | |
|---|---|---|---|---|
| 5,164,943 A | * | 11/1992 | DeSouza et al. | 714/703 |
| 5,502,732 A | * | 3/1996 | Arroyo et al. | 714/746 |
| 5,745,708 A | * | 4/1998 | Weppler et al. | 710/119 |
| 6,237,116 B1 | * | 5/2001 | Fazel et al. | 714/720 |
| 6,938,193 B1 | * | 8/2005 | Honda | 714/720 |
| 2006/0059404 A1 | * | 3/2006 | Cavanna et al. | 714/758 |

OTHER PUBLICATIONS

Ross Williams, "A Painless Guide to CRC Error Detection Algorithms," Internet Publication, Aug. 1993, available at ftp://ftp.rocksoft.com/papers/crc_v3.txt. (35 pgs).
R. Stewart et al., "Stream Control Transmission Protocol," Internet Engineering Task Force (IEFT) Publication, Oct. 2000, available at www.ieft.org. (126 pgs.).
J. Stone et al., "Stream Control Transmission Protocol (SCTP) Checksum Change," Internet Engineering Task Force (IETF) Publication, Sep. 2002, available at www.ieft.org. (16 pgs.).
D. Sheinwald et al., "Internet Protocol Small Computer System Interface (ISCSI) Cyclic Redundancy Check (CRC/Checksum Considerations," Internet Engineering Task Force (IEFT) Publication, available at www.ieft.org. (22 pgs.), date unknown.
J. Wendt et al., Data Integrity PowerPoint presentation entitled "ISCSI-R Data Integrity," slides 1-39, Version 2, Oct. 7, 2002.

* cited by examiner

Primary Examiner—Joseph D. Torres

(57) ABSTRACT

A method of generating a test data pattern for testing a CRC algorithm, the CRC algorithm configured to generate CRC values based on a generator polynomial, the method including identifying a desired pattern of intermediate CRC values. The method includes generating a test data pattern based on the desired pattern of intermediate CRC values and the generator polynomial, wherein the test data pattern is configured to cause the CRC algorithm to generate the desired pattern of intermediate CRC values.

17 Claims, 3 Drawing Sheets

TEST DATA PATTERN FOR TESTING A CRC ALGORITHM

BACKGROUND

A purpose of error detection techniques, such as techniques based on cyclic redundancy codes (CRCs), is to enable the receiver of a message transmitted through a noisy channel to determine whether the message has been corrupted. To do this, the transmitter generates a value (called a Frame Check Sequence or FCS) that is a function of the message, and typically appends the FCS to the message. The receiver can then use the same function used to generate the FCS of the received message to see if the message was correctly received.

With CRC algorithms, message bits are treated as binary coefficients of an n-bit polynomial. The message polynomial is typically multiplied by $x^m$, where m is the CRC polynomial (i.e., "generator polynomial") order. The result of the multiplication is divided by the CRC polynomial. Most implementations use a method that simultaneously executes the multiplication by $x^m$ and the division by the CRC polynomial, rather than doing these operations in sequential order. The result of these operations is the FCS, which is typically complemented and appended to the message. In some cases, the FCS is not complemented, and occasionally the FCS is put in another location, such as in a header field.

The receiver divides the received message with the appended FCS by the CRC polynomial. Assuming that the FCS was complemented before being appended to the message, and that no errors occurred during transmission, the result of the division at the receiver will be a fixed value equal to the result of dividing the order 2 m polynomial (with coefficients of 1 for the upper m terms, and coefficients of 0 for the lower m terms) by the CRC polynomial. This fixed value is sometimes called the "magic number," and depends on the polynomial. If the result of the division is not equal to the magic number, this indicates that an error occurred.

The method by which most CRC algorithms are specified involves describing the CRC polynomial, the initial and final states of the CRC computation, whether or not the input (data stream) is complemented prior to processing, and whether or not the result (the CRC) is complemented prior to being appended to the data stream that is being protected by the CRC. In addition, the algorithm may indicate the swapping of bytes to accommodate Little and Big Endian processors. Sample test patterns are usually provided to verify that the CRC algorithm implementation is correct.

A problem commonly faced by designers of software or hardware CRC algorithms is that, when the CRC algorithm produces incorrect results, there is little information to determine at which step of the process the algorithm failed. The sample test patterns typically do not help much, as the patterns only tell the implementer of the algorithm what to expect when the entire process is done, and the patterns provide no information about intermediate states of the CRC computation.

SUMMARY

One form of the present invention provides a method of generating a test data pattern for testing a CRC algorithm. The CRC algorithm is configured to generate CRC values based on a generator polynomial. The method includes identifying a desired pattern of intermediate CRC values. The method includes generating a test data pattern based on the desired pattern of intermediate CRC values and the generator polynomial, wherein the test data pattern is configured to cause the CRC algorithm to generate the desired pattern of intermediate CRC values.

DETAILED DESCRIPTION

In the following Detailed Description, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
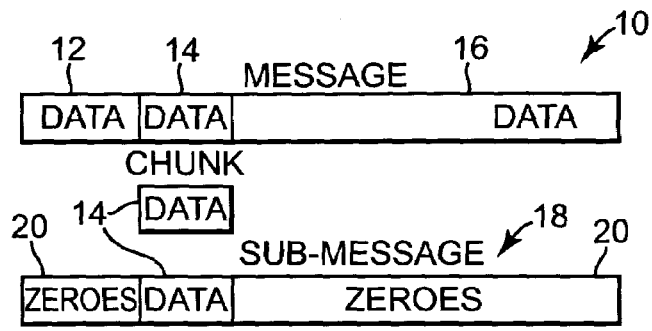
FIG. 1 is a graphical representation of a message divided into sub-messages, and a composite sub-message corresponding to one of the sub-messages.

FIG. 1 illustrates multiple-bit binary data message 10. In some communications protocols, such as certain Internet protocols, a data message, such as data message 10, may be packetized or divided into sub-messages for transmission. For example, an iSCSI data message may be protected with its CRC FCS and transmitted via multiple IP packets (which may be denoted as sub-messages). Message 10 may be arbitrarily divided into chunks of bits denoted as sub-messages 12, 14, and 16. Message 10 can be expressed as the modulo-2 (MOD-2) summation of the sub-messages. For this summation, each sub-message is modified with zeroes in place of the data from the remaining sub-messages. For example, consider sub-message 14. To be used in a MOD-2 summation to form message 10, sub-message 14 is modeled as composite sub-message 18. As can be seen, composite sub-message 18 has zeroes 20 in place of the sub-message data from sub-messages 12 and 16. When modeled in this fashion, each composite sub-message will have the same length (number of bits) as the original message 10.

Because the CRC calculation is a linear transformation, the CRC of message 10 is a sum of the CRCs of the composite sub-messages. As used herein, the CRC of a sub-message or composite sub-message will be denoted as an incremental CRC or intermediate CRC value.

As will be understood by persons of ordinary skill in the art, CRC calculations are performed using binary arithmetic MOD-2 with no carry. With such arithmetic, both addition and subtraction are equivalent to the logical exclusive-OR (XOR) operation, and multiplication is equivalent to a logical AND operation. Thus, the symbols "+" and "−" indicate a logical XOR.

Figure 2:
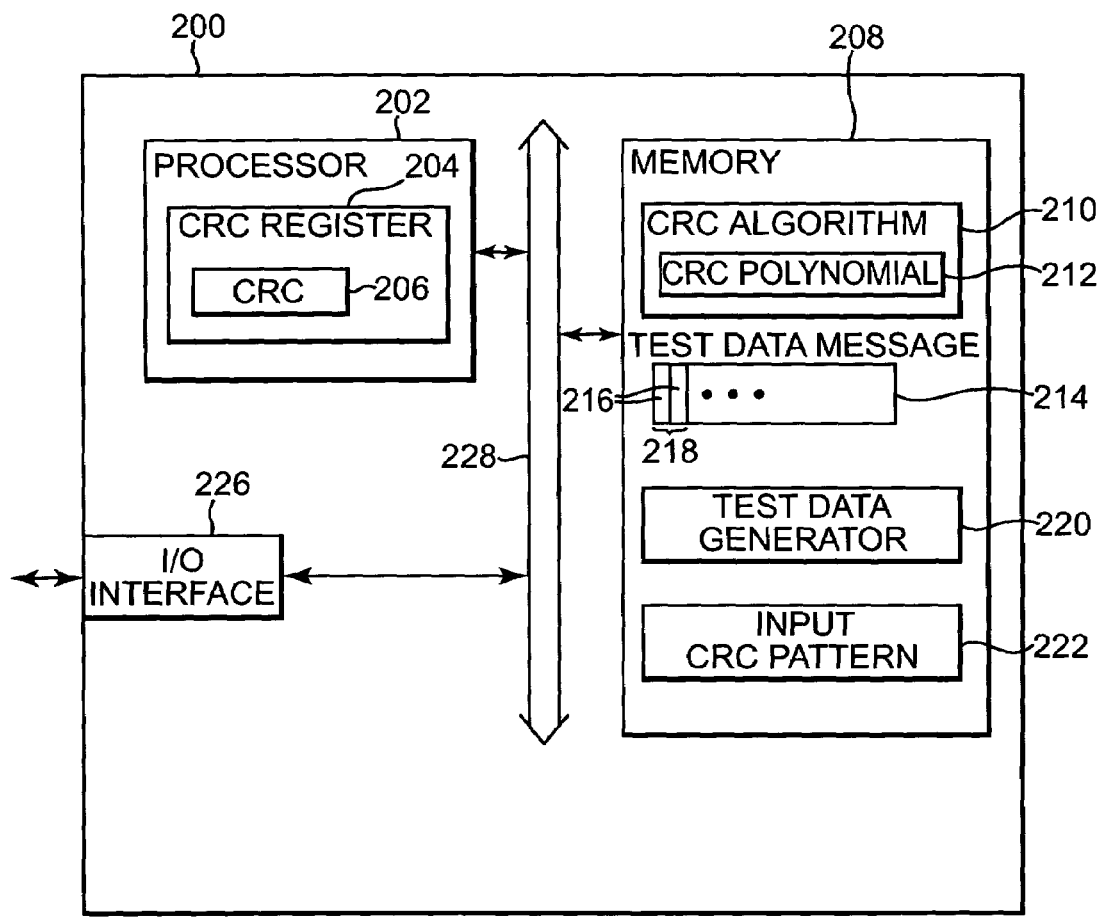
FIG. 2 is a block diagram illustrating a system for generating a test data pattern and for testing a CRC algorithm according to one embodiment of the present invention.

FIG. 2 is a block diagram illustrating a system 200 for generating a test data pattern and for testing a CRC algorithm according to one embodiment of the present invention. In one form of the invention, system 200 is a computer or like device. System 200 includes processor 202, input/output (I/O) interface 226, and memory 208, which are all communicatively coupled together via communication link 228. System 200 transmits and receives CRC protected data messages via I/O interface 226.

The memory 208 may include both volatile and nonvolatile memory components. Volatile components are those that do not retain data values upon loss of power. Nonvolatile components are those that retain data upon a loss of power. Thus, the memory 208 may comprise, for example, random access memory (RAM), read-only memory (ROM), hard disk drives, floppy disks accessed via an associated floppy disk drive, compact discs accessed via a compact disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

CRC algorithm 210, test data message 214, test data generator 220, and input CRC pattern 222, are stored in memory 208. Test data message 214 includes a plurality of 8-bit data bytes 216, with each set of two consecutive data bytes 216 comprising a data word or sub-message 218. In one embodiment, test data message 214 includes 1024 16-bit words 218. Processor 202 includes processor register (CRC register) 204, which stores a current CRC value 206. In one embodiment, CRC register 204 is a 16-bit register that stores a 16-bit CRC value 206. Processor 202 executes CRC algorithm 210 to process data messages, such as test data message 214, and generate corresponding CRCs based on a CRC generator polynomial 212 of the CRC algorithm 210. In one embodiment, data messages are processed by CRC algorithm 210 N bytes at a time, where N is an integer, and the intermediate CRC value 206 stored in register 204 is updated after each cycle of N bytes. In one embodiment, N equals two.

In one embodiment, test data message 214 is a "magic" test data pattern corresponding to a particular CRC algorithm, such as CRC algorithm 210. In one embodiment, the test data message 214 is used to test CRC algorithm 210, which may be implemented in hardware or software. A purpose of the test data message 214 is to facilitate verification that the algorithm 210 works as the designers intended. In one form of the invention, the test data message 214 allows the implementer of the CRC algorithm 210 to determine exactly where (e.g., which clock cycle) the process is failing, which makes the process of debugging algorithm 210 much easier. In one form of the invention, processor 202 executes test data generator 220 to generate test data message 214 based on a desired input CRC pattern 222 and the CRC generator polynomial 212. In one embodiment, the input CRC pattern 222 includes a plurality of intermediate CRC values 206 in a regular pattern.

In one form of the invention, when processed by CRC algorithm 210, the test data message 214 causes the generation of intermediate CRC values that increment by a value of one for every byte of the data message 214 that is processed (after an initial value is loaded and the processing of the data stream 214 begins). In this embodiment, the intermediate CRC values can be considered a count of the number of data bytes that have been processed by CRC algorithm 210. In another embodiment, the test data message 214 causes the generation of intermediate CRC values that decrement by a value of one for every byte of the data message 214 that is processed by CRC algorithm 210. In another embodiment, the test data message 214 causes the generation of intermediate CRC values that remain constant for every byte of the data message 214 that is processed by CRC algorithm 210.

In another embodiment, the test data message 214 causes the generation of intermediate CRC values with a bit that shifts by one bit position (or multiple bit positions) for every byte of the data message 214 that is processed by CRC algorithm 210. For example, in one embodiment, the test data message 214 causes the generation of a first intermediate CRC value of "00000001", a second intermediate CRC value of "00000010", a third intermediate CRC value of "00000100", etc. As can be seen from this example, the binary "1" in the intermediate CRC values is shifted to the left by one bit position each time a new byte of the data message 214 is processed by CRC algorithm 210. This pattern of intermediate CRC values is referred to as a "walking 1" pattern, or a bit-shifting pattern.

In another embodiment, the test data message 214 causes the generation of intermediate CRC values that toggle between two values for every byte of the data message 214 that is processed by CRC algorithm 210. For example, in one embodiment, the test data message 214 causes the generation of a first intermediate CRC value of "0xAAAA", a second intermediate CRC value of "0x5555", a third intermediate CRC value of "0xAAAA", etc. As can be seen from this example, the intermediate CRC values toggle between the values "0xAAAA" and "0x5555" for every byte of the data message 214 that is processed by CRC algorithm 210. This pattern of intermediate CRC values is referred to as a toggling value pattern.

In another form of the invention, CRC algorithm 210 processes data messages two bytes at a time, and the test data message 214 causes the generation of intermediate CRC values that increment (or decrement) by a value of two for every two 8-bit bytes 216 of the data message 214 that are processed by CRC algorithm 210. In one embodiment, test data generator 220 is configured to generate a test data message 214 that will produce any desired pattern of intermediate CRC values. CRC algorithm 210 and test data generator 220 are described in further detail below with reference to FIGS. 3 and 4.

It will be understood by a person of ordinary skill in the art that components of the present invention, including components of system 200, may reside in software on one or more computer-readable mediums. The term computer-readable medium as used herein is defined to include any kind of memory, volatile or non-volatile, such as floppy disks, hard disks, CD-ROMs, flash memory, read-only memory (ROM), and random access memory.

Figure 3:
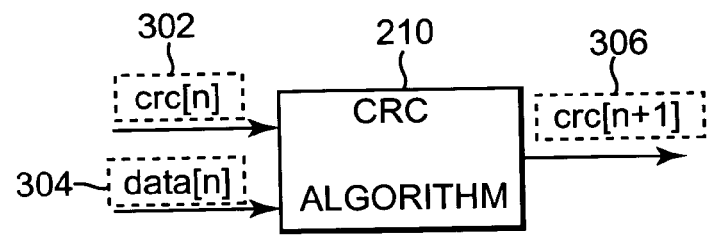
FIG. 3 is a block diagram illustrating operation of the CRC algorithm shown in FIG. 2 according to one embodiment of the present invention.

FIG. 3 is a block diagram illustrating operation of the CRC algorithm 210 shown in FIG. 2 according to one embodiment of the present invention. As shown in FIG. 3, CRC algorithm 210 receives a current intermediate CRC value (crc[n]) 302 and a current data value (data[n]) 304, and generates a next intermediate CRC value (crc[n+1]) 306 based on the values 302 and 304, and the CRC generator polynomial 212 (FIG. 2), where "n" is an integer that is used as an index to identify CRC values and data values. In one embodiment, the CRC values 302 and 306 are 16-bit intermediate CRC values that are stored in CRC register 204 (FIG. 2) after being calculated by CRC algorithm 210. In one embodiment, the current data value 304 is a 16-bit data value from a data message being processed, such as test data message 214 (FIG. 2). After being calculated, the next CRC value 306 generated by CRC algorithm 210 is stored in CRC register 204, and becomes the current CRC value 302 for the next iteration or cycle of the CRC calculation process. Thus, the CRC value in CRC register 204 is updated during each iteration of the CRC calculation process with a new (updated) CRC value 306.

The pattern of intermediate CRC values 306 produced by CRC algorithm 210 will vary based upon the CRC polynomial 212 of the CRC algorithm 210, and the pattern of input data values 304. The CRC values 306 for a given set of input data values 304 tend to have a random appearance. Even if a regular pattern of input data values 304 is applied to the CRC algorithm 210, the corresponding CRC values 306 will have a random appearance. However, in one form of the present invention, system 200 (FIG. 2) is configured to generate test data message 214, which, in one embodiment, is a seemingly random input data stream that results in a predictable and regular sequence of CRC values 306 as each data item 304 in the input data stream 214 is processed by the CRC algorithm 210. The generation of test data message 214 is described in further detail below with reference to FIG. 4.

Figure 4:
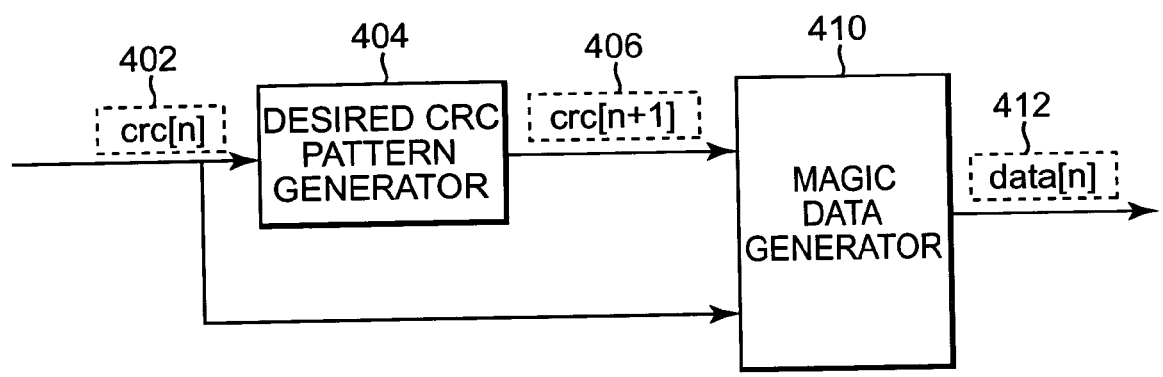
FIG. 4 is a block diagram illustrating operation of the test data generator shown in FIG. 2 according to one embodiment of the present invention.

FIG. 4 is a block diagram illustrating operation of the test data generator 220 shown in FIG. 2 according to one embodiment of the present invention. Test data generator 220 includes a desired CRC pattern generator 404 and a magic data generator 410. CRC pattern generator 404 receives a current intermediate CRC value (crc[n]) 402 and generates a next intermediate CRC value (crc[n+1]) 406, where "n" is an integer that is used as an index to identify CRC values and data values. In one embodiment, CRC pattern generator 404 generates intermediate CRC values 406 that increment by a value of two during each iteration of the data generation process. In other embodiments, CRC pattern generator 404 is configured to generate other patterns of intermediate CRC values 406. The pattern of intermediate CRC values generated by CRC pattern generator 404 is referred to as input CRC pattern 222 (FIG. 2). In one embodiment, the CRC values 402 and 406 are 16-bit intermediate CRC values.

Data generator 410 receives the next CRC value 406 along with the current CRC value 402, and generates a current data value (data[n]) 412 based on the values 402 and 406, and the CRC generator polynomial 212. In one embodiment, the current data value 412 is a two-byte (e.g., 16 bit) data value. For each subsequent iteration of the data generation process, the next CRC value 406 calculated by CRC pattern generator 404 becomes the current CRC value 402. The set of data values 412 generated by data generator 410 is referred to as test data message 214 (FIG. 2).

In one embodiment, data generator 410 is essentially an inverse CRC engine that generates the data values 412 based on the CRC generator polynomial 212, and the input CRC pattern 222, as will now be described in further detail. For the case where the CRC values 406 increment by a value of two during each iteration, data generator 410 calculates a 2-byte data value 412 during each iteration that, when processed by CRC algorithm 210, results in a new CRC value 406 that is the same as the previous CRC value 402 incremented by a value of two. In one embodiment, variable names are assigned to the unknown coefficients of the data value polynomial 412 being calculated, and a CRC computation is run on this data value polynomial 412. The result of this computation is a 16-bit polynomial whose coefficients are expressed in terms of the variable names that were assigned. Equating each such coefficient with the corresponding coefficient of the desired polynomial results in 16 modular equations with 16 unknowns. In one embodiment, data generator 410 includes conventional mathematical computation software to solve these 16 modular equations to determine the appropriate data 412 during each iteration.

In another embodiment, data generator 410 is configured to generate data values 412 based on a linear matrix equation. The CRC computation is a linear operation that can be represented by a linear matrix equation that describes the next value of the intermediate CRC 406 as a function of the present value of the intermediate CRC 402 and the present value of the input data 412. The linear matrix equation can then be solved for the input data 412, since the desired progression or pattern of CRC values 222 is known. The linear matrix equation is referred to as the "next state equation," because it shows the next state of the CRC 406 as a function of the present state of the CRC 402 and of the input data 412. It will be assumed in the following description of the next state equation that the intermediate CRC values 402 and 406 are 16 bits, and that a data message (e.g., test data message 214) is being processed 16 bits at a time, with each 16-bit segment of the data message represented by data value 412. The next state equation for a 16-bit CRC, processing 16 data bits per cycle, is given in the following Equation I:

$$c(n+1) = A\ c(n) + B\ d(n) \qquad \text{Equation I}$$

where:

$c(n+1)$ = next state CRC vector (column vector with 16 elements) representing intermediate CRC value 406;

$c(n)$ = present state CRC vector (column vector with 16 elements) representing intermediate CRC value 402;

$d(n)$ = present state data vector (column vector with 16 elements) representing data value 412;

A = constant 16 by 16 matrix, with elements 1 and 0, that depends on the CRC generator polynomial 212 being used; and B = constant 16 by 16 matrix, with elements 1 and 0, that depends on the CRC generator polynomial 212 being used.

The calculations in Equation I are based on MOD-2 math. The elements in the matrices (i.e., matrices A and B) and in the vectors (i.e., vectors c and d) are either 0 or 1. As indicated by Equation I, the constant matrix A is multiplied by the present state CRC vector, $c(n)$, and the constant matrix B is multiplied by the present state data vector, $d(n)$. Each of these two matrix multiplications results in a new vector. An XOR of the two new vectors is performed, and the result of the XOR is the next state CRC vector, $c(n+1)$.

The next state equation given in Equation I above can be manipulated into various forms depending upon the number of data bits processed per cycle and the width of the CRC used. For the case where the number of data bits processed per cycle is equal to the number of CRC bits, due to the nature of the CRC calculation, matrix A equals matrix B in the next state equation (Equation I). Thus, for this case, Equation I can be written in the form given by the following Equation II:

$$c(n+1) = A\ (c(n) + d(n)) \qquad \text{Equation II}$$

Multiplying c(n) and d(n) by the matrix A as shown in Equation II, and then rearranging the terms, results in the following Equation III:

$$A\ d(n) = c(n+1) - A\ c(n) \qquad \text{Equation III}$$

Multiplying both sides of Equation III by the inverse of matrix A (i.e., Inverse[A]) results in the following Equation IV:

$$d(n) = \text{Inverse}[A]\ c(n+1) - c(n) \qquad \text{Equation IV}$$

Since the arithmetic in Equation IV is in MOD-2, where subtraction is the same as addition and both operations are implemented with an XOR, Equation IV may be written in the form given in the following Equation V:

$$d(n) = \text{Inverse}[A]\ c(n+1)\ \text{XOR}\ c(n) \qquad \text{Equation V}$$

Equation V shows how to compute the present value of the data 412, d(n), from the current CRC value 402, c(n) and the next CRC value 406, c(n+1). In one embodiment, data generator 410 is configured to generate a data value 412 based on Equation V during each iteration of the data generation process.

Note that the matrix equation given in Equation V is basically a shorthand notation for 16 linear equations with 16 unknowns (i.e., the 16 data bits 412), and that the system of equations is, therefore, not over-constrained or under-constrained, and has a unique solution. For the case where the data width is the same as the CRC width, by providing a present CRC state, c(n), and the next desired CRC state, c(n+1), the data, d(n), that will cause this CRC state change can be computed based on Equation V. If more than 16 data bits, d(n), are processed per cycle, then multiple data patterns can be found that cause the same CRC state change (i.e., the system of equations is under-constrained and has multiple solutions). If less than 16 data bits, d(n), are processed per cycle, then there is no guarantee that a data pattern will be found to cause the desired CRC state change (i.e., the system of equations is over-constrained and may not have a solution).

Figure 5:
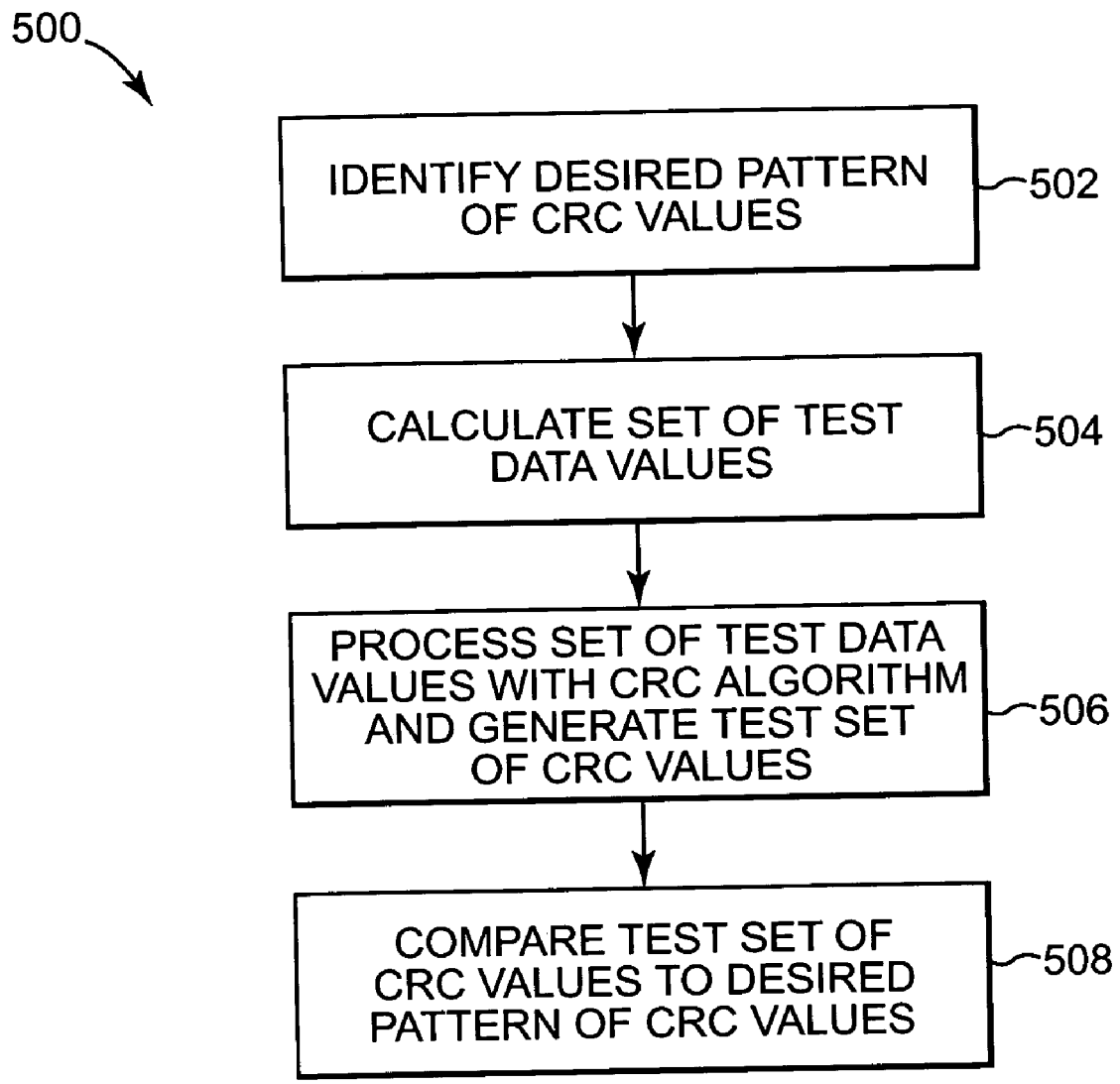
FIG. 5 is a flow diagram illustrating a method for testing a CRC algorithm according to one embodiment of the present invention.

FIG. 5 is a flow diagram illustrating a method 500 for testing a CRC algorithm according to one embodiment of the present invention. In one embodiment, system 200 (FIG. 2) is configured to perform method 500 to test CRC algorithm 210. At 502, a desired set or pattern of intermediate CRC values 222 is identified. In one embodiment, the desired pattern of CRC values 222 is generated by CRC pattern generator 404 (FIG. 4). At 504, a set of test data values are calculated by data generator 410 (FIG. 4) based on the desired set of intermediate CRC values 222 identified at 502, and the generator polynomial 212 for the CRC algorithm 210 being tested. The set of test data values calculated at 504 is referred to as the test data message 214. Each test data value (e.g., each 16-bit word 218) in the test data message 214 corresponds to one of the intermediate CRC values in the desired CRC pattern 222. At 506, the set of test data values calculated at 504 are processed by the CRC algorithm 210 to generate a test set of intermediate CRC values.

At 508, the test set of intermediate CRC values generated at 506 is compared to the desired pattern of intermediate CRC values 222 identified at 502. The comparison at 508 provides an indication of whether the CRC algorithm 210 is working properly. The comparison at 508 can be performed using software, or a simple hardware comparison circuit. If the CRC algorithm 210 is working properly, each CRC value in the test set of CRC values generated at 506 will be equal to a corresponding CRC value in the desired set of CRC values 222 identified at 502. If the CRC algorithm 210 is not working properly (e.g., one or more of the CRC values in the test set of CRC values are not equal to the corresponding CRC values in the desired set of CRC values 222), the cycle or cycles at which problems are occurring are easily identified. After any given number of clock cycles into processing of the test data message 214, the correct intermediate CRC value for this point in time is known. If the actual intermediate CRC value does not match the expected CRC value for this point in time, this indicates that an error has occurred.

The present invention, according to one embodiment, makes the process of implementing CRC algorithms easier as it makes it possible for a human observer or automated process to view the results of the CRC generating process at each intermediate step, and determine at which step the process failed.

Embodiments of the present invention can also be used as a built-in manufacturing test for CRC hardware to determine if the hardware is working as designed. For example, CRC pattern generator 404 (FIG. 4) can be implemented in hardware as part of a hardware self-test feature. Hardware to generate an incrementing CRC pattern, decrementing CRC pattern, bit-shifting CRC pattern, toggling value CRC pattern, or other similar pattern, is very small and efficient. For example, CRC pattern generator 404 can be implemented with a simple counter to generate an incrementing CRC pattern, or with a shift register to generate a bit-shifting CRC pattern. Using a simple comparison circuit, the CRC pattern supplied by the CRC pattern generator hardware 404 can be compared to the CRC values generated by the CRC hardware based on a received test data pattern 214 (FIG. 2), to determine if the CRC hardware is working properly. The exact cycle where a failure occurs is easily determined. The test data pattern 214 can be supplied to the CRC hardware externally through the normal data path used by the CRC hardware, and a test mode can be selected in a conventional manner.

In contrast, to implement such a built-in self-test feature without using a CRC pattern generator 404 that generates a regular CRC pattern, a reference CRC pattern would need to be supplied to the hardware through a separate data path (other than the normal data path), or stored in local storage (e.g., ROM), which greatly complicates the design.

Embodiments of the present invention also provide other advantages over prior techniques for specifying and testing CRC algorithms. One form of the present invention uses a regular CRC pattern 222 (e.g., incrementing, decrementing, constant, or other pattern) that is generated a priori or in lock step with operation of the CRC algorithm 210 for direct comparison of the CRC values at each step or cycle of the process. That is, the test data generator 220, which computes the test data pattern 214, can run in parallel with the CRC algorithm 210, and their results compared at each step of the process, instead of just at the end of the process.

One embodiment of the present invention may also be used to enhance the methods currently used to specify CRC algorithms by effectively providing an independent specification for the same algorithm. This alternate specification is easily implemented and can be simulated in lock step with the actual algorithm in order to provide a check at each clock cycle. One form of the present invention makes the process of specifying CRC algorithms less ambiguous since the algorithm is effectively being specified by two independent means, and the results of both means are known at each stage of the process.

In addition, when computing the CRC of a message that has been broken up into several sub-messages, it sometimes becomes necessary to resume the computation by reloading the last CRC value computed from processing the previous sub-message, and subsequently continuing with the current sub-message. In such cases, one embodiment of the invention makes it trivial to verify that the current CRC value is equal to the number of bytes processed so far.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of generating a test data pattern for testing a CRC algorithm, the CRC algorithm configured to generate CRC values based on a generator polynomial, the method comprising:
    identifying a desired pattern of intermediate CRC values; and
    generating a test data pattern based on the desired pattern of intermediate CRC values and the generator polynomial, wherein:
        said generating comprises using an inverse CRC algorithm;
        wherein the test data pattern includes a plurality of test data values, each of the test data values corresponding to one of the intermediate CRC values, and wherein each of the test data values is generated based on the corresponding one of the intermediate CRC values and a next subsequent one of the intermediate CRC values; and
        the test data pattern is configured to cause the CRC algorithm to generate the desired pattern of intermediate CRC values.

2. The method of claim 1, wherein the desired pattern of intermediate CRC values is an incrementing pattern, wherein successive ones of the intermediate CRC values in the pattern differ by a fixed value.

3. The method of claim 2, wherein the fixed value is the same as a number of bytes processed by the CRC algorithm per cycle.

4. The method of claim 1, wherein the desired pattern of intermediate CRC values is a decrementing pattern, wherein successive ones of the intermediate CRC values in the pattern differ by a fixed value.

5. The method of claim 4, wherein the fixed value is the same as a number of bytes processed by the CRC algorithm per cycle.

6. The method of claim 1, wherein the desired pattern of intermediate CRC values is a constant pattern, wherein the intermediate CRC values in the pattern have the same value.

7. The method of claim 1, wherein the desired pattern of intermediate CRC values is a bit-shifting pattern, wherein a bit in successive ones of the intermediate CRC values in the pattern is shifted by at least one bit position.

8. The method of claim 1, wherein the desired pattern of intermediate CRC values is a value toggling pattern, wherein the intermediate CRC values in the pattern toggle back and forth between two values.

9. The method of claim 1, wherein the test data pattern includes a plurality of test data values, and wherein the step of generating a test data pattern comprises:
    (i) calculating an inverse of a matrix representing the generator polynomial; and
    (ii) multiplying the inverse of the matrix by an XOR of a first vector representing the current one of the intermediate CRC values and a second vector representing the next subsequent one of the intermediate CRC values, wherein a result of the multiplication provides one of the test data values.

10. The method of claim 9, and further comprising:
    repeating step (ii) for each of the plurality of test data values.

11. The method of claim 1, wherein the CRC algorithm processes N bytes of the test data pattern per cycle, wherein N is an integer, and wherein each of the intermediate CRC values has N bytes.

12. A method of testing a CRC algorithm, the CRC algorithm configured to process a data message and generate corresponding intermediate CRC values based on a generator polynomial, the method comprising:
    generating a desired set of intermediate CRC values;
    generating a set of test data values based on the desired set of intermediate CRC values and the generator polynomial, wherein:
        said generating comprises using an inverse CRC algorithm;
        each of the test data values corresponding to one of the intermediate CRC values;
        and
        each of the test data values is generated based on the corresponding one of the intermediate CRC values and a next subsequent one of the intermediate CRC values;
    processing the set of test data values with the CRC algorithm, thereby generating a test set of intermediate CRC values; and
    comparing the test set of intermediate CRC values to the desired set of intermediate CRC values.

13. The method of claim 12, wherein the desired set of intermediate CRC values is one of an incrementing pattern and a decrementing pattern, wherein successive ones of the intermediate CRC values differ by a fixed value.

14. The method of claim 12, wherein the intermediate CRC values in the desired set have the same value.

15. The method of claim 12, wherein the intermediate CRC values in the desired set are in a bit-shifting pattern, wherein a bit in successive ones of the intermediate CRC values in the desired set is shifted by at least one bit position.

16. The method of claim 12, wherein the intermediate CRC values in the desired set toggle between two values.

17. The method of claim 12, wherein the CRC algorithm is implemented in CRC hardware, and wherein the steps of generating a desired set and comparing the test set are performed with test hardware in the CRC hardware.

* * * * *